United States Patent [19]

Moffat

[11] Patent Number: 4,597,736
[45] Date of Patent: Jul. 1, 1986

[54] METHOD AND APPARATUS FOR HEATING SEMICONDUCTOR WAFERS

[75] Inventor: William Moffat, Sunnyvale, Calif.

[73] Assignee: Yield Engineering Systems, Inc., Sunnyvale, Calif.

[21] Appl. No.: 729,911

[22] Filed: May 3, 1985

[51] Int. Cl.$^4$ ............... F27B 3/22; F27B 5/04; C23C 14/00; C23C 16/00
[52] U.S. Cl. .................................. 432/26; 34/36; 118/50.1; 118/725; 219/400; 432/198; 432/205
[58] Field of Search .............. 432/9, 26, 198, 200, 432/201, 202, 205; 219/390, 400, 406; 34/36; 118/50.1, 725

[56] References Cited

U.S. PATENT DOCUMENTS

| 1,802,000 | 4/1931 | Brooke | 432/198 |
| 4,223,048 | 9/1980 | Engle, Jr. | 219/390 |
| 4,347,431 | 8/1982 | Pearce et al. | 219/390 |
| 4,375,027 | 2/1983 | Zeto et al. | 219/390 |

Primary Examiner—John J. Camby
Attorney, Agent, or Firm—Paul L. Hickman

[57] ABSTRACT

A method and apparatus for heating semiconductor wafers characterized by the release of preheated nitrogen into an oven to considerably reduce heating time for the wafers. The oven is evacuated prior to the release of the preheated nitrogen.

9 Claims, 2 Drawing Figures

METHOD AND APPARATUS FOR HEATING SEMICONDUCTOR WAFERS

BACKGROUND OF THE INVENTION

1. Field of the Invention

This invention relates generally to industrial ovens, and more particularly to methods and apparatus for heat treating semiconductor wafers.

2. Description of the Prior Art

Discrete semiconductor devices are formed in arrays on a surface of disk-shaped semiconductor wafers. After the devices are formed on a wafer, the wafer is cut into individual chips which are then packaged and sold.

A common step in the production of semiconductor devices is to heat the semiconductor wafer in an oven. Typically, twenty-five wafers are loaded on a cassette, and eight cassettes are placed within the oven.

In the prior art, the loaded cassettes are heated within vacuum ovens or within ovens filled with an inert gas to minimize reaction with the wafers. Vacuum ovens heat the wafers primarily by radiation and conduction, while inert gas ovens additionally heat the wafers by convection. Inert gas ovens usually heat the wafers more quickly due to their additional mode of heat transfer.

Inert gas ovens are first sealed and then flooded with an inert gas, such as nitrogen. Heating elements within the walls of the oven are energized to heat the nitrogen to operational levels. The heating elements in the walls of the oven also heat the shelves upon which the cassettes are resting, permitting heat to be conducted through the cassettes to the wafers that they are supporting.

A problem with conventional inert gas ovens is that the gas, which is usually stored under compression, is relatively cool when it enters the oven, having given up most of its heat energy in adiabatic expansion. In consequence, time is wasted heating the inert gas to operating temperatures, increasing the time that the wafers must remain within the oven.

Also, with increasing frequency, the semiconductor industry is using TEFLON cassettes to hold the semiconductor wafers due to their resistance to contamination and low reactivity with most materials. However, a problem encountered with a TEFLON cassettes is that they are very good heat insulators which all but eliminates heat conduction to the wafers from the shelves of the oven. Thus, TEFLON cassettes reduce the efficiency of inert gas ovens, and are even less suitable for vacuum ovens which rely heavily upon heat conduction from the shelves. The prior art response to the heat conduction problem of TEFLON is either to accept a longer heating time for the semiconductor wafers or transfer the wafers into another cassette for heating within the oven.

SUMMARY OF THE INVENTION

An object of this invention is to provide a method and apparatus for more quickly heating semiconductor wafers within an inert gas oven.

Briefly, the method comprises the steps of placing semiconductor wafers within an oven, preheating a quantity of inert gas, injecting the preheated inert gas into the oven, and subsequently applying heat to the gas within the oven. The oven is evacuated prior to the injection of the gas. Preferably, the semiconductor wafers should be shielded from thermal conduction such that substantially all their heating is due to convective heat transfer with the inert gas.

The apparatus of the present invention includes an oven having a chamber, a source of inert gas, and means for preheating and releasing preheated the inert gas into the chamber. Means are also provided for evacuating the chamber prior to the release of the gas.

A major advantage of this invention is that by preheating the nitrogen, the time required to heat the semiconductor wafers is greatly reduced.

These and other objects and advantages of the present invention will no doubt become apparent upon a reading of the following descriptions and a study of the several figures of the drawing.

DETAILED DESCRIPTION OF THE PREFERRED EMBODIMENT(S)

Figure 1:
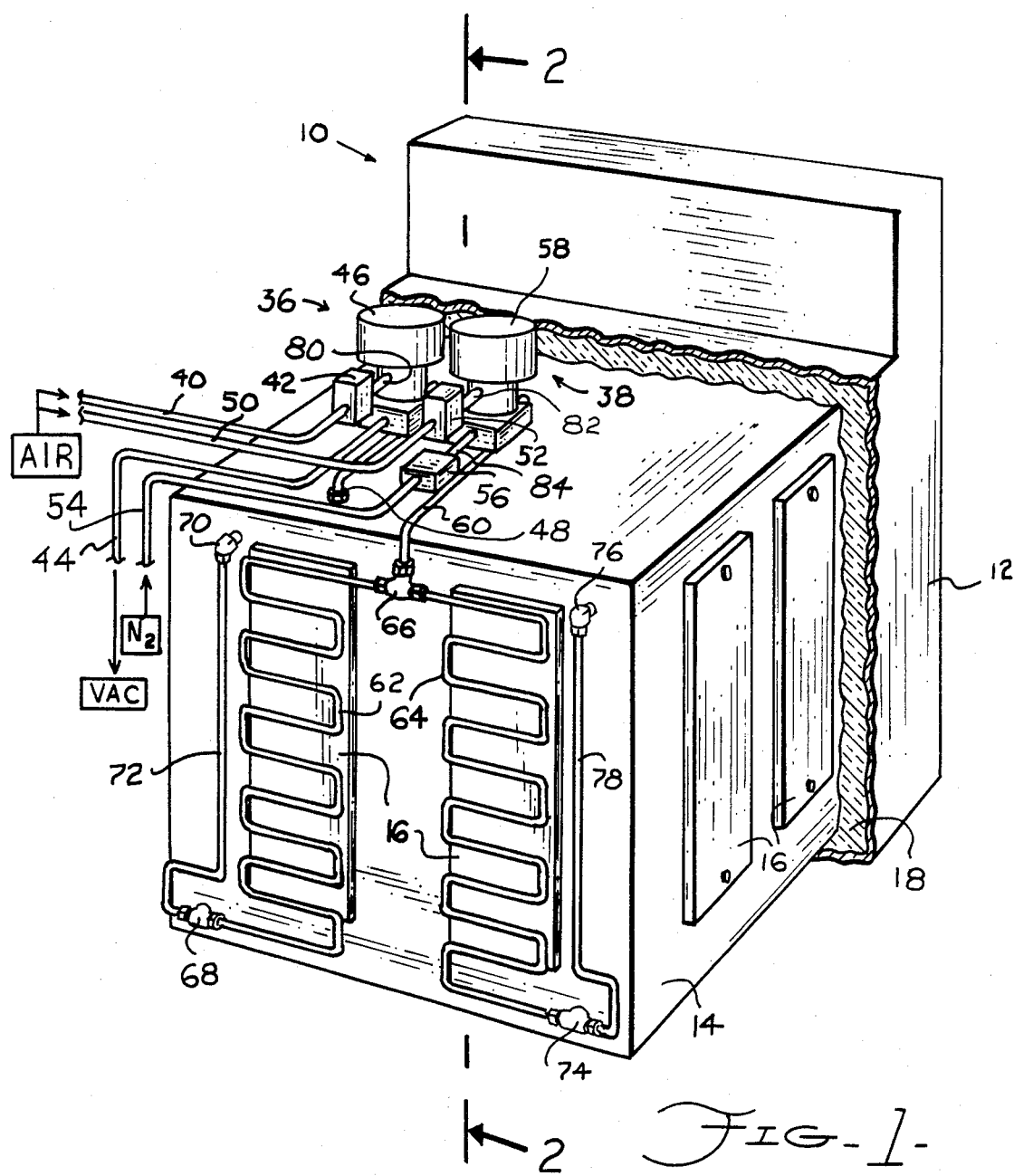
FIG. 1 is a perspective view of the oven apparatus with its outer shell removed to show the heaters, heat exchangers, and valves of the present invention.

Referring to FIG. 1, an apparatus 10 for heating semiconductor wafers includes an outer shell 12, an inner core 14, and a number of heater panels 16 attached to the outer surface of core 14. Thermal insulation 18 is disposed between shell 12 and core 14 to minimize heat transfer.

Figure 2:
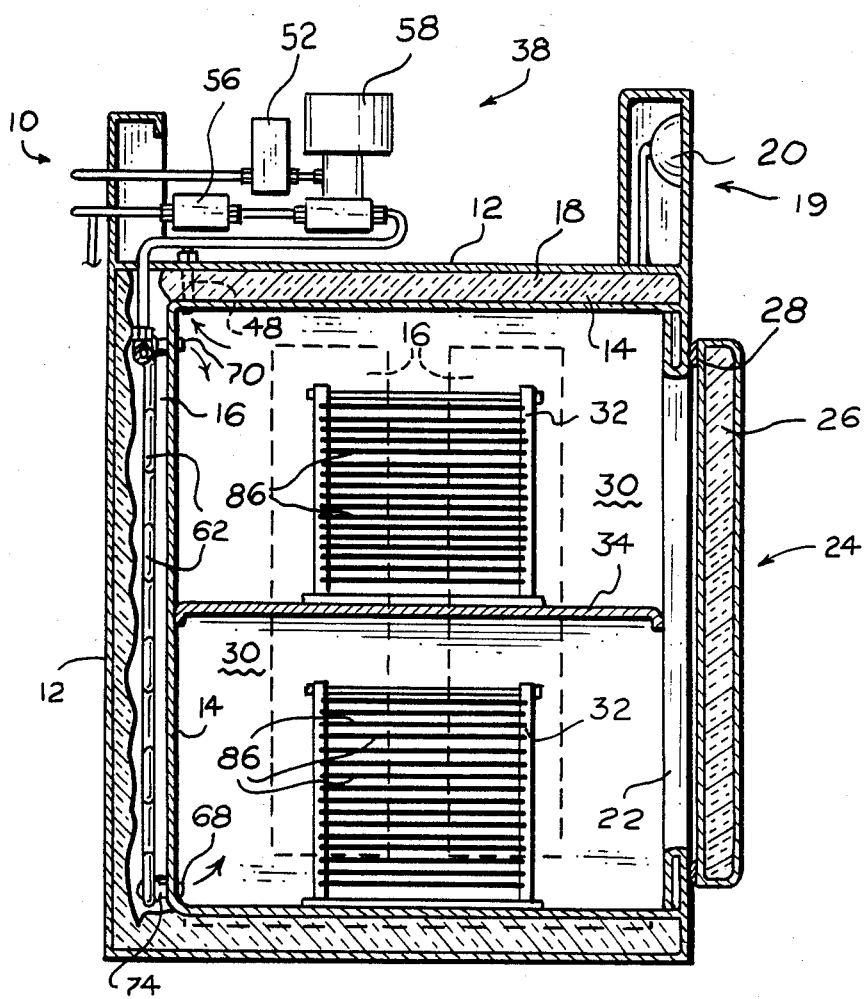
FIG. 2 is a cross section taken along line 2—2 of FIG. 1.

Referring additionally to the cross section of FIG. 2, shell 12 is provided with an indicator panel 19 housing various indicators 20, and has an opening 22 which can be closed by a door 24. Door 24 is provided with an insulating material 26 and edge seals 28 to minimize heat loss through opening 22.

Still referring to FIG. 2, the chamber 30 within core 14 is preferably large enough to accept up to eight semiconductor cassettes 32. Core 14 is preferably provided with at least one rack 34 to support some of cassettes 32 in the upper portion of chamber 30.

Referring again to FIG. 1, apparatus 10 further includes a vacuum valve assembly 36 and a nitrogen valve assembly 38. Vacuum valve assembly 36 includes an air inlet pipe 40, and an electric solenoid 42, a vacuum line 44, a valve head 46, and a vacuum line 48. Nitrogen valve assembly 38 includes an air inlet pipe 50, an electric solenoid 52, a nitrogen inlet pipe 54, a filter 56, a valve head 58, and a nitrogen outlet pipe 60. The nitrogen outlet pipe 60 is coupled to heat exchanger coils 62 and 64 by a T coupling 66.

Heat exchanger coil 62 is bent to a serpentine pattern along the length of a heater panel 16, and is connected at one end to T coupling 66 and at its other end to a T inlet 68. T inlet 68 is coupled to an inlet 70 by a pipe 72. Similarly, heat exchanger coil 64 is bent into a serpentine configuration to increase heat transfer from a heater panel 16, and is coupled at one end to T coupling 66 and at its other end to a T inlet 74. T inlet 74 is coupled to an inlet 76 by a pipe 78.

Referring again to vacuum valve assembly 36 of FIG. 1, when electric solenoid 42 is activated by the oven apparatus' control circuitry (not shown), it is opened and compressed air (at approximately 60 PSI) flows through air inlet pipe 40 and a short connecting pipe 80 to valve head 46, causing valve head 46 to open. The opening of valve head 46 couples vacuum line 44 to vacuum line 48 which, as can be best seen in FIG. 2, permits gases within core 14 to be drawn out of chamber 30. When chamber 30 has been sufficiently evacuated, solenoid 42 is de-activated, shutting off valve head 46. The vacuum line 44 can be coupled to a conventional vacuum pump, a blower, or other types of low pressure sinks.

The nitrogen valve assembly 38 operates in a manner analogous to the operation of vacuum valve assembly 36. When solenoid 52 is activated by the control circuitry, pressurized air, usually at 60 PSI, is forced through air inlet pipe 50 and a short connecting pipe 82 into valve head 58. Low pressure nitrogen flows through pipe 54 (at about 15-20 PSI), through a 0.5 micron filter 56, a short connecting pipe 84, and through nitrogen outlet pipe 60. The low pressure nitrogen then flows through heat exhanger coils 62 and 64 and into T inlets 68 and 74, and into inlets 70 and 76. T inlet 68 and inlet 70 can be seen in FIG. 2 to communicate with chamber 30, as do T inlet 74 and inlet 76.

As is readily apparent from the foregoing discussion, the low pressure nitrogen flowing through the heat exchanger coil 62 and 64 causes the nitrogen to be preheated before it is injected into the chamber 30 of the oven apparatus. This provides for effective conductive heating of the silicon wafers 86 stored within the cassettes 32.

The method of the present invention includes the loading of thermally insulating cassettes 32 (such as those cassettes made from TEFLON and other synthetic resin polymers) with silicon wafers 86, and placing the cassettes 32 within chamber 30 of the oven apparatus 10. After door 24 is closed, chamber 30 is evacuated through vacuum valve assembly 36. Nitrogen valve assembly 38 is then activated to inject preheated nitrogen into chamber 30. The nitrogen stays within chamber 30 for a predetermined period of time unitl it is once again evacuated through vacuum valve assembly 36. A typical heating cycle would evacuate the chamber 30 for one minute, and then would inject heated nitrogen to chamber 30 and allow it to remain there for three minutes.

Tests of the present invention indicates dramatic reduction in required heating time due to the use of preheated nitrogen and the heat insulating cassettes. With the oven set to 100° C., to reach 90% of operational temperatures wafers in a metal cassette took 18 minutes in a vacuum; 16 minutes at atmospheric pressure utilizing un-preheated nitrogen; and 8 minutes at atmospheric pressure utilizing preheated nitrogen. When the wafers were placed in a TEFLON cassette and the preheated nitrogen at atmospheric temperatures was used the wafers reached 90% of operational temperatures in 5 minutes.

While this invention has been described in terms of a few preferred embodiments, it is contemplated that persons reading the preceding descriptions and studying the drawing will realize various alterations, permutations and modifications thereof. It is therefore intended that the following appended claims be interpreted as including all such alterations, permutations and modifications as fall within the true spirit and scope of the present invention.

What is claimed is:

1. A method for heating semiconductor wafers comprising:
   placing at least one wafer within a chamber of an oven;
   evacuating said chamber;
   preheating a quantity of an inert gas by causing said inert gas to move past a heating element of said oven which is external to said chamber;
   releasing said quantity of preheated inert gas into said previously evacuated chamber; and
   applying heat energy to said inert gas within said chamber.

2. A method for heating semiconductor wafers as recited in claim 1 further comprising substantially insulating said wafer from thermal conduction with said oven or any support structure located within said oven such that said wafer is heated primarily by convective heat transfer with said inert gas.

3. A method for heating semiconductor wafers as recited in claim 2 wherein said step of isolating said wafer from from thermal conduction includes the step of placing said wafer within a thermally insulating cassette.

4. An apparatus for heating semiconductor wafers comprising:
   an oven having a chamber and means disposed within said chamber for supporting at least one semiconductor wafer, said oven having a least one heating element located externally of said chamber;
   a source of inert gas;
   means for evacuating said chamber;
   means for guiding a quantity of said inert gas past said heating element to preheat said inert gas;
   means for releasing said preheated quantity of gas into said chamber after said chamber has been evacuated; and
   oven heating means adapted to provide heat energy for said inert gas after it has been released into said chamber.

5. An apparatus for heating semiconductor wafers as recited in claim 4 further comprising means for insulating said wafer from heat conduction.

6. An apparatus for heating semiconductor wafers as recited in claim 5 wherein said means for insulating said wafer includes a heat insulating cassette.

7. An oven apparatus comprising:
   a core enclosure provided with a heating chamber and a door opening;
   a door associated with said door opening and operative to open and close said door opening;
   a source of inert gas;
   gas valve means coupling said source of inert gas to said heating chamber;
   heater means for providing heat energy to the contents of said heating chamber including at least one heater panel attached to exterior surface of said core enclosure;
   means for preheating said inert gas prior to its release into said heating chamber including a convoluted heat exchange conduit placed in proximity to said heater panel to increase heat exchange therebetween;
   a low pressure sink; and
   vacuum valve means coupling said low pressure sink to said heating chamber.

8. An oven apparatus as recited in claim 7 further comprising an outer shell surrounding much of said core enclosure.

9. An oven apparatus as recited in claim 8 further comprising thermal insulation means disposed between said outer shell and said core enclosure.

* * * * *